United States Patent [19]

Thomas

[11] Patent Number: 5,414,301
[45] Date of Patent: May 9, 1995

[54] HIGH TEMPERATURE INTERCONNECT SYSTEM FOR AN INTEGRATED CIRCUIT

[75] Inventor: Michael E. Thomas, Cupertino, Calif.

[73] Assignee: National Semiconductor Corporation, Santa Clara, Calif.

[21] Appl. No.: 197,359

[22] Filed: Feb. 16, 1994

Related U.S. Application Data

[63] Continuation of Ser. No. 513,433, Apr. 23, 1990, abandoned, which is a continuation of Ser. No. 86,200, Aug. 18, 1987, Pat. No. 4,920,071, which is a continuation of Ser. No. 712,589, Mar. 15, 1985, abandoned.

[51] Int. Cl.⁶ ............ H01L 23/48; H01L 29/40; H01L 29/96; H01L 29/62
[52] U.S. Cl. ............... 257/740; 257/741; 257/751; 257/764; 257/770
[58] Field of Search ............ 357/67, 71; 257/740, 257/741, 751, 764, 770

[56] References Cited

U.S. PATENT DOCUMENTS

| | | | |
|---|---|---|---|
| 4,283,439 | 8/1981 | Higashinakagawa | 437/192 |
| 4,398,335 | 8/1983 | Lehrer | 437/193 |
| 4,451,326 | 5/1984 | Gwozdz | 437/195 |
| 4,491,860 | 1/1985 | Lim | 357/71 |
| 4,502,209 | 3/1985 | Eizenberg et al. | 437/190 |
| 4,533,154 | 11/1985 | Tsujii | 357/71 |
| 4,545,116 | 10/1985 | Lau | 29/591 |
| 4,556,897 | 12/1985 | Yorikane et al. | 357/67 |
| 4,570,328 | 3/1986 | Price et al. | 29/591 |
| 4,665,414 | 5/1987 | Koeneke et al. | 357/67 |
| 4,675,715 | 6/1987 | Lepselter et al. | 257/924 |
| 4,679,310 | 7/1987 | Ramachandra et al. | 357/51 |
| 4,821,085 | 4/1989 | Haken et al. | 357/42 |
| 4,829,363 | 5/1989 | Thomas et al. | 357/54 |
| 4,873,204 | 10/1989 | Wong et al. | 437/200 |

FOREIGN PATENT DOCUMENTS

| | | | |
|---|---|---|---|
| 0174773 | 3/1986 | European Pat. Off. | |
| 2238249 | 2/1975 | France | |
| 2402304 | 3/1979 | France | 357/67 |
| 58-0854 | 5/1983 | Japan | 357/67 |
| 58-98968 | 6/1983 | Japan | |
| 59-167059 | 9/1984 | Japan | 357/67 |
| 59-168666 | 9/1984 | Japan | 357/67 |
| WO8203948 | 11/1982 | WIPO | 357/67 |
| 82/03948 | 11/1992 | WIPO | |

OTHER PUBLICATIONS

Full English Translation of Higuchi et al., Japan Kokai Number 58-98968, (13 Jun. 1983) pp. 1-8.

F. Mohammadi, "Siliceides for Interconnection Technology" *Solid State Technology* (Jan. 1981) pp. 65-91.

"High Aspect Ratio Hole Filling with CVD Tungsten for Multi-Level Interconnection", Suguro, et al., extended abstract 18th conf. Solid Devices & Matl., Tokyo pp. 503-506 (1986).

"Diffusion Barriers in Thin Films", by Nicolet, *Thin Solid-Films*, 52 (1978), pp. 415-443.

"TiN and TaN as Diffusion Barriers in Metalizations to Silicon Semiconductors Devices", by Wittmer, *Applied Physcis Letters* 36(6), 15 Mar. 1980 pp. 456-458.

"Applications of TiN Thin Films and Silcon Device Technoloby", by Wittmer, et al., *Thin Solid Films*, 93 (1982) pp. 397-405.

"Reaction Kinetics of Tungsten Thin Films on Silicon (100) Surfaces", by Locker et al., pp. 4366-4369, *Journal of Applied Physics*, vol. 44, No. 10, Oct. 1973.

"Fabrication of Short Channel Mosfets With Refractory Metal Gates Using RF Sputter Etching", by Rodriquez et al., pp. 17-21 Solid-State Electronics, (1976).

"Control of Resistivity, Microstructure, and Stress in Electron Beam Evaporated Tungsten Films", by Sinha et al., pp. 436-444, *Journal of Vacuum Society Technology*, vol. 10, No. 3, May/Jun. 1973.

(List continued on next page.)

Primary Examiner—J. Carroll
Attorney, Agent, or Firm—Stephen R. Robinson; William H. Murray

[57] ABSTRACT

A semiconductor integrated circuit device is provided with an electrical interconnect system which is stable at high temperatures. The interconnect system employs refractory metal compounds which are electrically conductive, which form stable couples with silicon and compounds thereof, and which remain stable at temperatures exceeding approximately 500° C.

1 Claim, 13 Drawing Sheets

OTHER PUBLICATIONS

"Reactively Sputtered ZrN Used as An AL/Si Diffusion Barrier in a Zr Contact To Silicon", by Ostling et al., pp. 281–283, *Journal of Vacuum Science Technology*, A2(2), Apr.–Jun. 1984.

"Barrier Layers: Principles and Applications in Microelectronics", by Wittmer, pp. 273–280, *Journal of Vacuum Science Technology*, A 2 (2), Apr.–Jun. 1984.

"Characteristics of DC Magnetron, Reactively Sputtered $TiN_x$ Films for Diffusion Barriers in III–V Semiconductor Metallization", by Noel et al., pp. 284–287, *Journal of Vacuum Science Technology* A 2(2), Apr.–Jun. 1984.

"TiN Formed by Evaporation as a Diffusion Barrier Between Al and Si", by Ting, pp. 14–18, *Journal of Vacuum Science Technology* vol. 21, No. 1, May/Jun. 1982.

"Pressure Dependence of the Electrical Properties of TaN Thin Films" by Shioyama et al., pp. 45–48, *Thin Solid Films*, 57, 1979.

"Electrical and Structural Properties of Tantalum Nitride Thin Films Deposited by Sputtering", by Petrovic et al, pp. 333—336, *Thin Solid Films*, 57, 1979.

"Reliability of PtSi–Ti/W–Al Metallization System Used in Bipolar Logics", by Canali et al., IEEE/PROC. IRPS, pp. 230–237, Jun. 1981 *Applied Physics Letter*, vol. 36, No. 6, Mar. 1980, pp. 456–458, New York, N.Y, article entitled "TiN and TaN as Diffusion Barriers in Metallizations to Silicon Semiconductor Devices", Marc Wittmer.

Extended abstract, vol. 81-2 (1981) Oct., Pennington, N.J., pp. 864–865, entitled "Termal Stability of Titanium and Hafnium Nitride Thin Films In Contact with Metallic Overlayers Investigated by Backscattering", Suni et al.

*Journal of Applied Physcis*, vol. 53, No. 2, Feb 1982, pp. 1007–1012, New York, N.Y., article entitled "Interfacial Reactions Between Aluminum and Transition-metal Nitride and Carbine", Films, Marc Wittmer.

*Journal of Applied Physics*, vol. 52, No. 6, Jun. 1981, pp. 4297–4299, New York, N.Y., article entitled "Thermal Stability of Titanium Nitride and Shallow Junction Solar Cell Contracts", N. W. Cheung et al.

*Thin Solid Films*, vol. 119, No. 1, Sep. 1983, pp. 23–30, Lausanne, Swit., article entitled "Resistivity, Oxidation Kinetics and Diffusion Barrier Properties of Thin Film $ZrB_2$", Snappirio et al.

*Thin Solid Films*, vol. 96, No. 4, Oct. 1982, pp. 317–326 Lausanne, Swit., article entitled "General Aspects of Barrier Layers for Very–Large–Scale Integration Applications II: Practice", Nowicki et al.

HIGH TEMPERATURE INTERCONNECT SYSTEM FOR AN INTEGRATED CIRCUIT

This is a continuation of application Ser. No. 07/513,433, filed on Apr. 23, 1990, abandoned, which is a continuation of application Ser. No. 07/068,200, filed on Aug. 18, 1987, now U.S. Pat. No. 4,920,072, which is a continuation of application Ser. No. 712,589, filed on Mar. 15, 1985, now abandoned.

The present invention relates generally to construction of semiconductor integrated circuit devices and more particularly to constructions which inhibit silicon transport during high temperature processing and/or operation of such devices.

Semiconductor integrated circuits are commonly fabricated utilizing aluminum and aluminum alloy metallizations to create device contacts and interconnects. Because of the use of these aluminum and aluminum alloy metallization techniques, it is imperative that the device not be practically exposed to temperatures in excess of approximately 500° C. Exposure to higher temperatures would cause the metallization to hillock, melt or substantially react with other materials in the structure and thereby degrade or destroy the device. However, it is desirable to construct devices where the interconnect is conductively coupled to silicon and is capable of withstanding high substrate temperatures, for example on the order of 550° C. to 1000° C., since such high temperatures are utilized in various processing techniques such as planarization utilizing PVX reflow.

Heretofore, refractory metals having very high melting points, such as tungsten and molybdenum, could not be used as interconnects because these metals can react with Si at high temperatures, forming silicide phases in the contact regions. Upon formation, these silicides have higher resistivities than the parent metals and also consume silicon in the contact regions which will eventually destroy the device. In the past, MOS technology has been able to use refractory metals of tungsten and molybdenum as interconnects to gate oxides at elevated temperatures, in the range of 900° C. to 1000° C.; but, such refractory metal interconnects are used to control the potential of gates via a field effect, and, as such, they are exclusively in contact with $SiO_2$ with which they are stable. In this case, these materials are not directly coupled to the underlying silicon and constrains their use in bipolar and MOS applications at high temperatures.

At present, metal barrier layers do exist in interconnect schemes which use PtSi/Ti:W/Al—Si. However, these structures are unstable after short exposure at temperatures in the range of 500° to 550° C. in which the Al—Si reacts with the Ti:W barrier layer and eventually attacks the PtSi phase and the underlying contact. Other recent work has investigated the use of titanium and zirconium nitrides as barriers with Al metallizations and stablity to 600° C. has been observed. However, the reactivity of Al with these materials eventually breaks down the barrier with subsequent attack of the underlying silicon. Although its resistivity is lower than other refractory materials by approximately a factor of 2, the melting point and rapid reactivity of aluminum with most materials at relatively low temperatures makes it unattractive for high temperature applications. This is where the application of a refractory metal or refractory metal compound with good stability over a barrier layer can be used to great advantage in high temperature processing, for example that which implements reflow planarization. It is therefore advantageous to provide a semiconductor device structure which includes an interconnect system which can make electrical contact with silicon and which remains stable at elevated operating and/or processing temperatures.

In addition to the desirability of providing semiconductor devices having interconnect systems which are capable of withstanding elevated processing and operating temperatures, it should be noted that as the dimensions of the emitter contacts decrease, current crowding occurs in the contact regions. This effect can increase the probability of junction spiking due to Al migration into the emitter or failure of the interconnect due directly to electromigration. Consequently, it is also advantageous to provide a semiconductor interconnect structure which would alleviate these problems.

It is further advantageous to develop self aligned barrier structures to aid in the definition of tighter contact geometries and provide etch stops to dry plasma and wet chemical processes during interconnect definition which do not allow the etchant to see the underlying silicon.

SUMMARY OF THE INVENTION

It is therefore the object of the present invention to provide a semiconductor device with a new high temperature interconnect system for a semiconductor integrated circuit device which does not exhibit the aforementioned degraded performance and structural characteristics caused by exposure to high temperature processing or high current density operation.

It is another object of the present invention to provide a method for inhibiting silicon transport with barrier layer/refractory metal metallurgy or barrier layer/refractory metal compound metallurgy which is stable during the high temperature processing and operation of semiconductor devices.

It is a further object of the present invention to provide a silicon transport barrier which also acts as an etch stop thereby mitigating the detrimental effects of photolithographic alignment errors incurred during processing.

It is yet another object of the present invention to replace aluminum or aluminum metal alloys with refractory materials which do not degrade the physical integrity of the barrier layers and are able to withstand exposure to elevated temperatures beyond the melting point of aluminum.

It is an additional object of the present invention to provide a stable metallurgical interconnect system which enables high temperature reflow planarization so that multilevel metal interconnect schemes can be realized.

These and other objects which will become apparent are achieved in accordance with the present invention by providing an interconnect system in an integrated circuit device, which system is stable at temperatures in excess of 500° C. The interconnect system preferably employs refractory metal compounds which are electrically conductive, which form stable couples with silicon, and which remain stable at high temperatures. The system is fabricated by forming an electrically conductive diffusion barrier in the contact regions of the integrated circuit device, which barrier layer does not appreciably react with silicon at elevated temperatures in the range of room temperature to approximately 1050°

C. The barrier formation can be accomplished in a variety of ways using reactive growth, ion implantation, or physical or chemical vapor deposition techniques. In one embodiment of the present invention, the electrically conductive diffusion barrier also serves as at least a portion of the electrical interconnect structure of the device.

In another embodiment of the invention, a conductive refractory metal or refractory metal compound layer is formed over the device, into the contact regions with the barriers formed therein, then etched to form a predetermined pattern of electrical interconnects. In a further embodiment of the present invention, a planarizing surface is formed above the barrier or refractory metal interconnects by forming, then reflowing, a layer of electrically insulating material, for example glass, thereover. In yet another embodiment of the present invention, via holes are formed in the planarized insulating layer in a predetermined pattern. Refractory metal or refractory metal compounds are formed therein in order to enable the formation of an additional interconnect layer over the insulating layer. Once the interconnects are formed in the interconnect layer, another planarizing surface can then be formed above the interconnects by forming, then reflowing, a layer of electrically insulating material, for example glass. Additional vias interconnects and insulating layers can be formed as desired to create multilayer structures which remain stable during high temperature processing and/or operation.

Other objects, features and advantages of the present invention will be more fully apparent from the following detailed description of the preferred embodiment, the appended claims and the accompanying drawings.

DETAILED DESCRIPTION OF THE PREFERRED EMBODIMENT

Figure 1A:
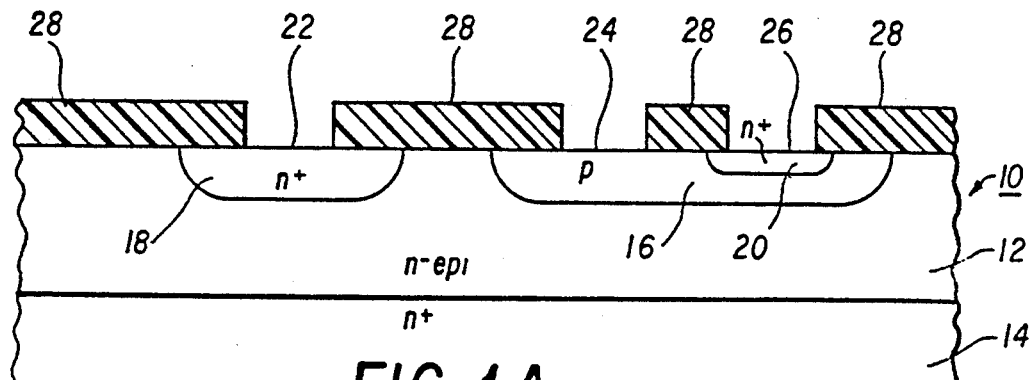
FIGS. 1A-I is a diagrammatic cross-sectional representation of the processing stages of a preferred method for constructing a device in accordance with the present invention.

Although specific forms of the invention have been selected for illustration in the drawings, and the following description is drawn in specific terms for the purpose of describing these forms of the invention, this description is not intended to limit the scope of the invention which is defined in the appended claims.

Referring to FIG. 1 and particularly to FIG. 1A, there is shown in diagrammatic cross-sectional form, a bipolar transistor device, generally designated 10, which has been fabricated to the point at which metal contacts are to be formed. The bipolar transistor device 10 includes an n− epi layer 12 on an n+ substrate 14. The n= epi layer 12 has a p region 16 and a n+ region 18 formed therein. The p region 16 has an n+ region 20 formed therein. Contact regions 22, 24 and 26 are created over the n+ 18, p 16 and n+ 20 regions respectively by forming apertures in a silicon dioxide layer 28 which has been formed over the upper surface of the n− epi layer 12 as well as the n+ 18, p 16 and n+ 20 regions formed therein.

It should be noted that the bipolar device structure selected here is an example which has been chosen to assist in setting forth the detailed description of the present invention. However, it would be equally valid to use other MOS or diode structures to demonstrate embodiments of this invention and the use in such other structures is deemed to be within the scope and contemplation of the present invention.

Figure 1B:
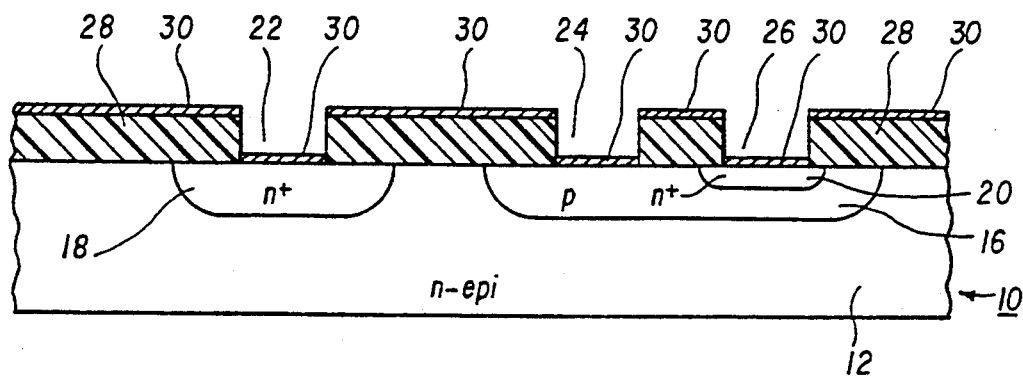

Referring now to FIG. 1B, a very thin layer 30 (preferably on the order of 200Å to 500Å in thickness) of a refractory metal, preferably titanium, zirconium, or hafnium is formed in the upper contact regions 22, 24 and 26 as well as on the upper surfaces of the silicon dioxide layer 28. It is preferred that the refractory metal layer 30 be formed into the contact regions and over the silicon dioxide surface with poor step coverage for reasons which will be subsequently described. Consequently, it is preferred that the refractory metal layer 30 be formed for example using electron beam evaporation of the refractory metal at an incidence angle perpendicular to the surface. Typical power to gun is 2KW at $1 \times 10^{-6}$ torr or better with a rate between 5° and 50° per second. Although electron beam deposition is preferable, chemical vapor deposition, sputtering, physical examination or ion beam deposition could also be used to deposit the refractory metal layer 30.

Figure 1C:
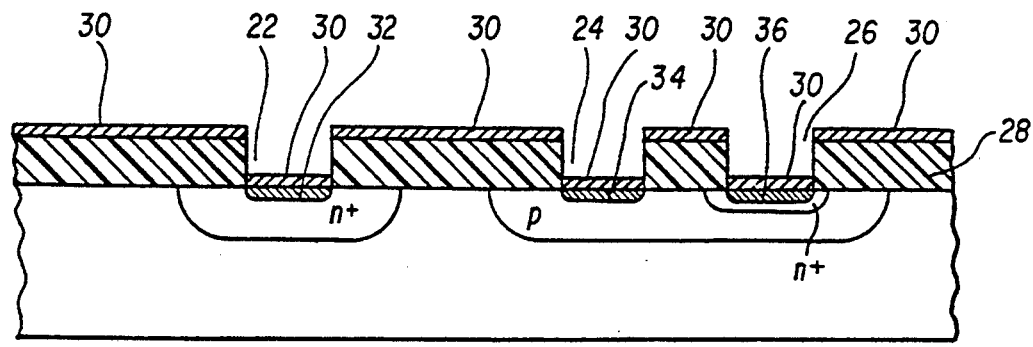

Referring now to FIG. 1C, the structure is heated in an ambient of high purity hydrogen or argon or vacuum at an elevated temperature in the range of from approximately 600° C. to approximately 1000° C., for a period of time ranging from approximately a few seconds to 15 minutes in order to form metal disilicide regions 32, 34 and 36 within the contact regions 22, 24 and 26 respectively. The silicide transformation process can be accomplished using standard heat treating furnaces or rapid isothermal annealing. Since silicon is the major diffusing species in the silicide formation process, it is important to control the processing times at elevated temperatures in order to restrict the flow of silicon from the immediate vicinity of the contact regions. If the reaction conditions are not controlled, large amounts of silicon will be removed from the doped junctions in the contact holes and greatly modify their desired dimensions and integrity. By purposely introducing poor step coverage during deposition of the refractory metal layer 30 prior to heat treatment, it is possible to more favorably localize the silicide reaction in the contact. Although this process is preferred, with proper control of the heat treatment cycle required to form the silicide phase, chemical vapor deposition or sputtering are also suitable processes for the deposition of the refractory metal layer 30 as previously stated.

Figure 1D:
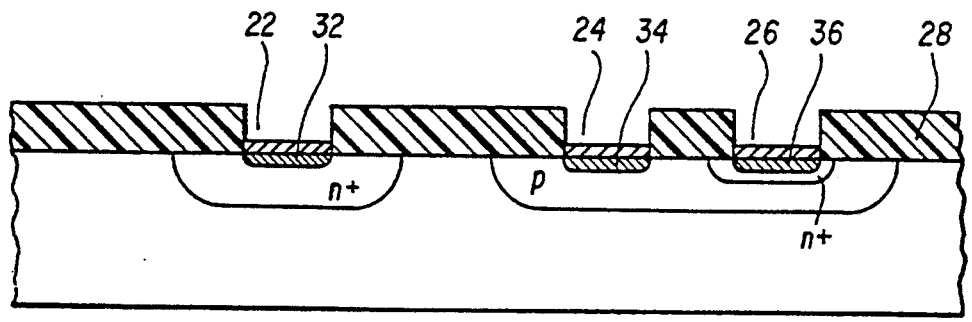

The structure ($TiSi_2$ with unreacted Ti in the fields for example) is placed in a selective chemical etchant, for example, hydrogen peroxide/ammonium hydroxide (3:1 parts by volume) which attacks the unreacted refractory metal (Ti) while leaving the metal disilicide regions 32, 34 and 36, within the contact regions 22, 24 and 26 respectively, intact as shown in FIG. 1D.

Figure 1E:
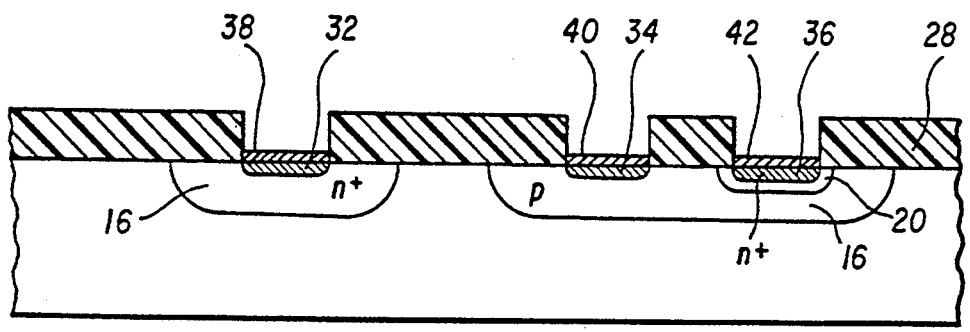

Referring to FIG. 1E, the structure is then sputter cleaned in an argon ambient to remove any surface oxide formed on the disilicide phase prior to exposing the structure to a high temperature ambient of high purity nitrogen, boron, or carbon bearing species, or by physically depositing boron or carbon bearing compounds, in order to convert the exposed surfaces of the metal disilicide regions 32, 34 and 36 to a metal nitride, metal boride, or metal carbide respectively thereby forming barrier layers 38, 40 and 42. The temperature range for these reactions is typically 600° C. to 1000° C. For example, the exposed surfaces can be converted to titanium nitride by exposing titanium disilicide to nitrogen at a temperature of about 850° C. for approximately one hour. Low energy ion implantation of nitrogen, boron, or carbon into the contact regions followed by a high temperature thermal cycle can also be used to form the barrier layers 38, 40 and 42 above the silicide layers 32, 34 and 36 respectively. Typical implantation energies for these species range from hundreds to tens of thousands of electron volts depending on the effective cross-section of the elements in the contact region.

These newly formed layers 38, 40 and 42, which possess metallic properties, act as diffusion barriers to silicon from the underlying junctions 16, 18 and 20 respectively. In most cases, refractory metal nitrides, borides, or carbides have been found to be stable after intimate contact with refractory metals or disilicides at high temperatures. Although a ternary or quarternary analysis is required in order to determine the absolute stability of the barrier layer material, in many cases, the kinetics of transformation are so slow that for practical device applications (up to 1 to 2 hours at elevated device temperatures of 950° C. to 1000° C.), the material couple can be considered stable whether or not the thermodynamics strictly dictate a stable couple. Examples of this stability will be shown subsequently.

Figure 1F:
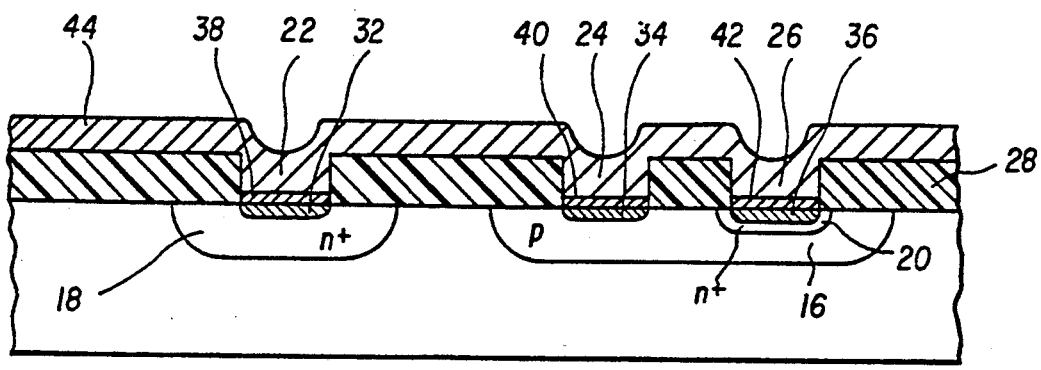

Referring to FIG. 1F, a refractory metal layer 44, which will be used to generate interconnects, is deposited over the silicon dioxide layer 28 into the contact regions 22, 24 and 26 over the metal nitride, metal boride or metal carbide barrier layers 38, 40 and 42. It is preferable that the refractory metal possess low resistivity, preferably 10 micro-ohm centimeter or less, but for other device applications resistivities in the hundreds of micro-ohm centimeters should also be acceptable. From a bipolar device viewpoint, the most desirable refractory metals would be tungsten or molybdenum which possess resistivities on the order of 5 to 10 micro-ohm centimeters under ideal conditions. A series of possible combinations of barrier layer structures and interconnect metallizations is shown in Table 1.

TABLE I

Preferred Materials for High Temperature Interconnects

| Nitrides | Barrier Layers Borides | Carbides |
|---|---|---|
| HfN | $HfB_2$ | HfC |
| ZrN | $ZrB_2$ | ZrC |
| TiN | $TiB_2$ | TiC |
| TaN | $TaB_2$ | TaC |
| NbN | $NbB_2$ | NbC |
| VN | $VB_2$ | VC |
| — | — | WC, $W_2C$ |
| — | — | MoC, $Mo_2C$ |
| $CR_2N$ | $CrB_2$ | $Cr_3C_2$ |

Interconnects

Tungsten
Molybdenum
All of nitrides above.
All of borides above.
All of carbides above.
$WSi_2$, $MoSi_2$, $TaSi_2$, $NbSi_2$, $ZrSi_2$, $TiSi_2$, $VSi_2$, $CrSi_2$ In bipolar applications where the overall sheet resistivity of the interconnect must be as low as possible, the refractory metal interconnects would preferably be 1.5 to 3 times greater in thickness than the replaced aluminum. However, for many MOS device applications where the contact resistivity dominates the overall interconnects resistance, thin layers of refractory metals on the order of thousands of angstroms can be used.

Figure 1G:
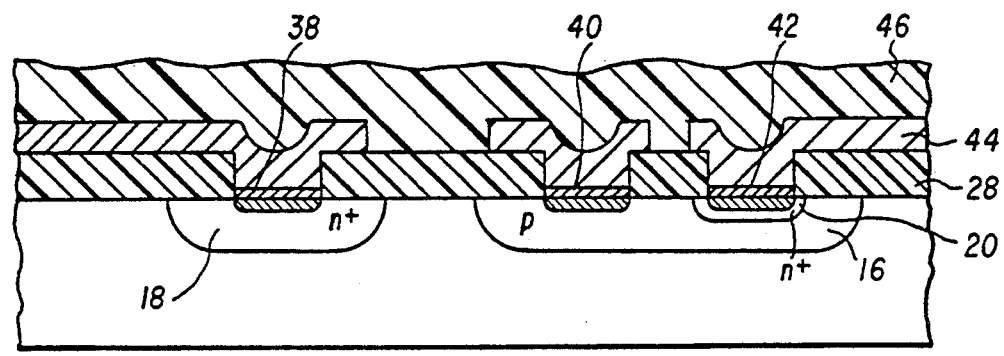

Referring to FIG. 1G, an interconnect pattern is defined in the refractory metal layer 44 utilizing, for example, standard plasma etching techniques. In the preferred process, a layer of photoresist is spun onto the refractory layer 44 then exposed and developed to define the desired interconnect pattern. The refractory metal layer is then dry etched with a flourine or chlorine based plasma which selectively attacks the metal. Misalignment errors over the contact holes will not be critical since the relative etch ratio of the underlying barrier layer to refractory metal interconnect layer is small. The nitride, boride and carbide materials of barrier layers 38, 40 and 42 will protect the underlying doped silicon junctions 18, 16 and 20 respectively.

As shown in FIG. 1G, the structure is coated with a layer of glass 46, preferably phosphovapox glass (PVX), which layer is thicker than the layer of the refractory metal 44 which is used to define the interconnects. The entire structure is then heated to a high temperature in the range of 800° C. to 1050° C., to enable the glass to flow under surface tension forces in order to smooth the surface topography of the structure as is shown in FIG. 1H.

Figure 1H:
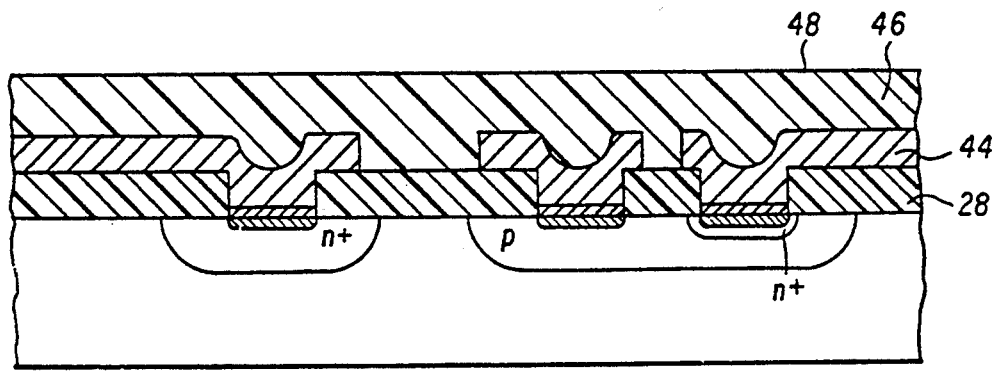
Figure 1I:
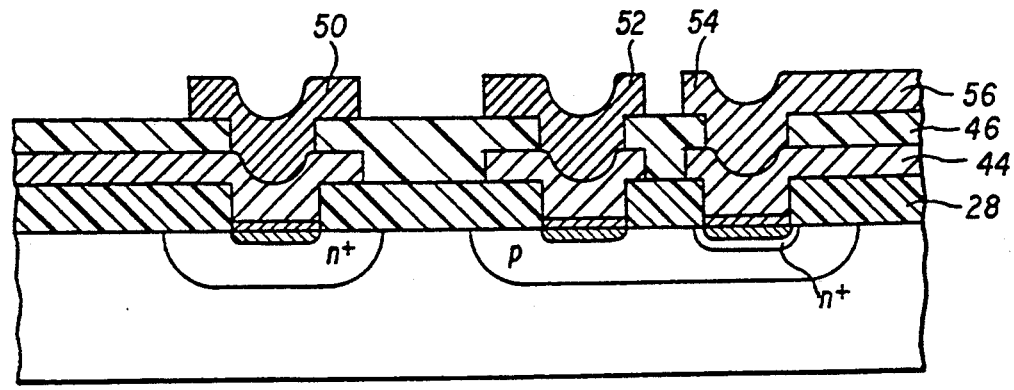

Once the upper surface 48 of the glass layer 46 is substantially planarized as shown in FIG. 1H, via aperture are etched in layer 46. The via apertures expose the underlying refractory metal interconnect layer 44 at predetermined locations. A refractory material layer is deposited onto the planarized surface 48 into the via apertures thereby contacting the underlying interconnect layer 44 at the aforementioned predetermined locations. The refractory metal is then formed into a predetermined pattern of interconnects 56 using, for example, standard plasma etching techniques previously described. This enables the formation of an additional interconnect layer 56 as shown in FIG. 1I. By repetatively depositing a glass layer, reflowing it, and opening apertures which make connections between subsequent metal layers possible, one can build a vertical multilevel interconnect structure with a large number of metal layers which enables a more efficient utilization of all the transistors on an integrated circuit device.

Referring now to. FIG. 2, there is shown, in diagrammatic form, the processing stages of an alternate preferred method for constructing a device in accordance with the present invention. Depicted in FIG. 2A, in diagrammatic cross-sectional form, is a bipolar transistor device, generally designated 200, which has been fabricated to the point at which metal contacts are to be formed, such as that depicted in FIG. 1A. Contact regions 210, 212 and 214 are created over n+, p and n+ regions 216, 218 and 220 respectively, having been formed in an n− epi layer 222 of the device, by forming apertures in a silicon dioxide layer 224 which has been disposed over the upper surface of the n− epi layer 222. Once again it should be noted here, as well as in all succeeding examples, that the bipolar device structure selected is exemplary and that the use of the present invention in other MOS or diode structures is deemed to be within the scope and contemplation of the present invention.

Figure 2A:
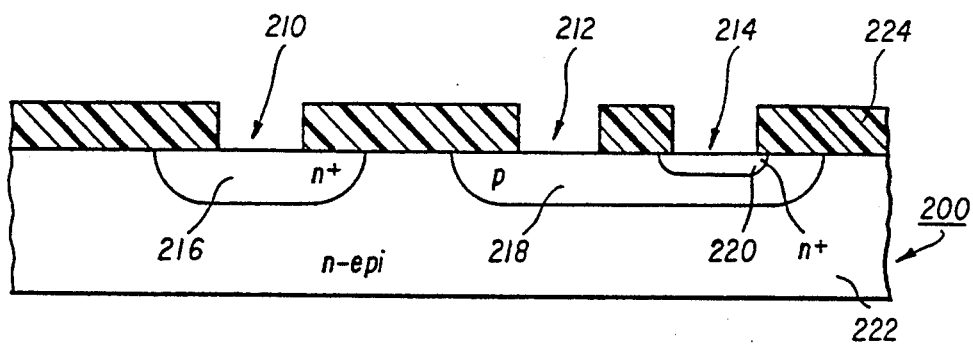
FIGS. 2A-D is a diagrammatic cross-sectional representation of the processing stages of an alternate preferred method for constructing a device in accordance with the present invention.
Figure 2B:
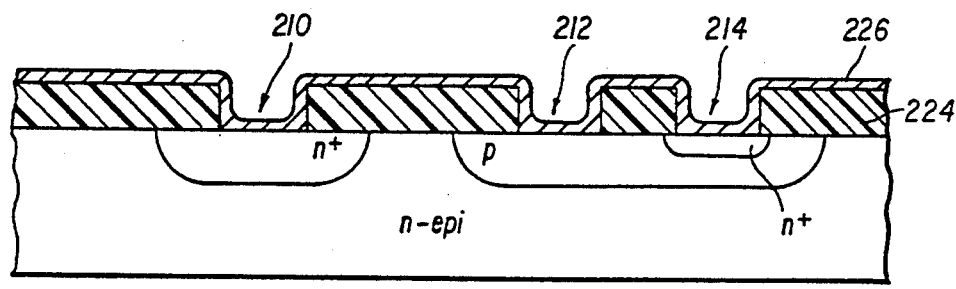

Referring now to FIG. 2B, a barrier layer 226, comprising a metal nitride, boride or carbide, which forms a stable couple with silicon at temperatures in excess of approximately 500° C., is formed over the silicon dioxide layer 224 into the contact regions 210, 212 and 214, making electrical contact with the underlying doped regions. The barrier layer material is preferably a refractory metal nitride, boride or carbide of such metals as tungsten, molybdenum, tantalum or titanium. Note also, that in accordance with Table I, niobium, zirconium, vanadium and chromium can also be used. The barrier layer may be formed by any known deposition techniques, such as chemical vapor deposition (CVD), sputtering, physical examination or ion beam deposition.

Figure 2C:
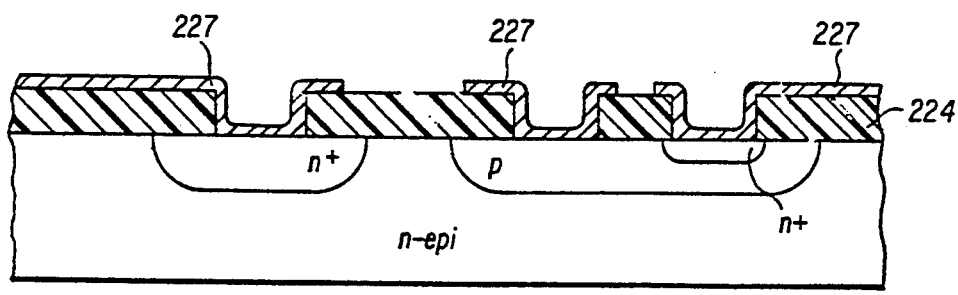
Figure 2D:
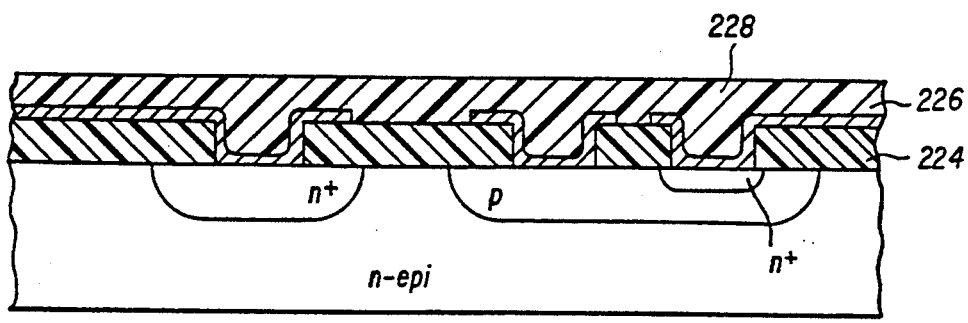

Referring to FIG. 2C, a pattern of interconnects 227 is defined in the barrier layer 226 utilizing, for example, standard plasma etching techniques. In the preferred process, a layer of photoresist is spun onto the barrier layer 226 then exposed and developed to define the desired interconnect pattern. The barrier metal layer is then dry etched with a flourine or chloride based plasma which selectively attacks the barrier layer material. Although this approach removes the attractiveness of self-alignment of the barrier material to the contact holes, it is completely acceptable in many device applications. The interconnects 227 formed by the patterned barrier layer 226, are then coated with an insulating layer 228, preferably PVX, which is then planarized as depicted in FIG. 2D. The planarization is preferably implemented utilizing the technique previously described in conjunction with FIG. 1G and 1H.

Once the upper surface of the insulating layer 228 is planarized, via holes can be generated in the layer 228 by etching and a refractory material can thereafter be deposited and patterned forming vias. This enables the formation of an additional interconnect layer in a manner similar to that described with respect to the previous embodiment in conjunction with FIG. 1I. In a manner similar to the previously described, a vertical multilevel interconnect structure can be fabricated.

Referring now to FIG. 3, there is shown, in diagrammatic form, the processing stages of yet another alternate preferred method for constructing a device in accordance with the present invention. Once again, the description of this alternate preferred method begins with a bipolar transistor device, generally designated 300, having contact regions 310, 312 and 314 formed in a silicon dioxide insulating layer 316. A barrier layer 318 is deposited over the silicon dioxide layer 316 into the contact regions 310, 312 and 314, making contact with the underlying doped regions of the silicon epi layer. As in the previously described embodiments, the barrier layer 318 is preferably a refractory metal nitride, boride or carbide material which forms a stable couple with silicon at elevated temperatures in excess of approximately 500° C. The barrier layer 318 is deposited utilizing known techniques such as CVD, sputtering, physical examination or ion beam deposition.

Figure 3A:
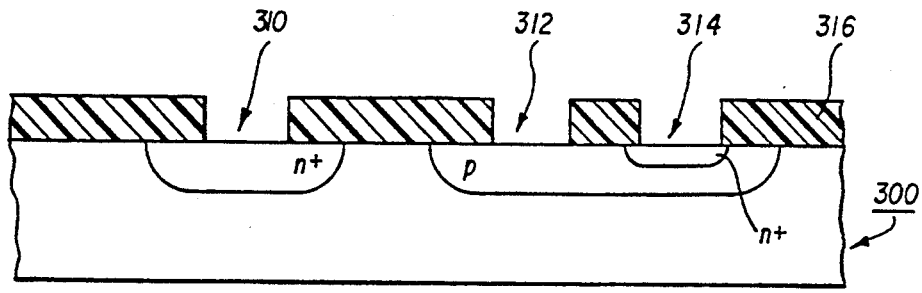
FIGS. 3A-E is a diagrammatic cross-sectional representation of the processing stages of yet another alternate preferred method for constructing a device in accordance with the present invention.
Figure 3B:
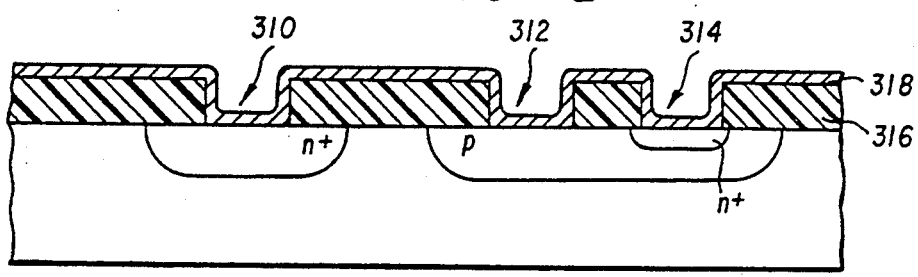
Figure 3C:
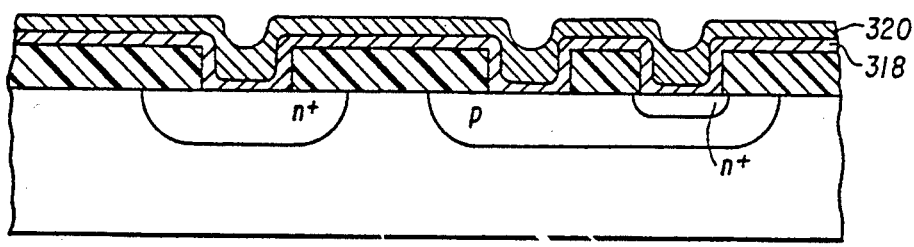
Figure 8A:
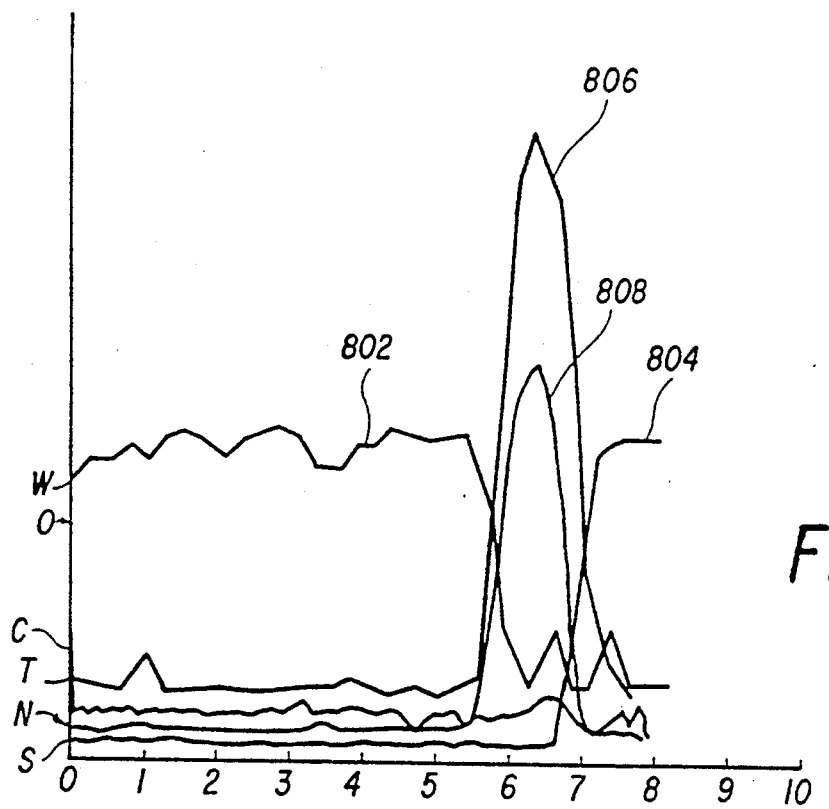
FIG. 8 depicts Auger depth profiles of one embodiment of a structure utilizing a silicon transport barrier in accordance with the present invention, FIG. 8($a$) depicting the depth profile of the structure before, and FIG. 8($b$) after, heating the structure.
Figure 8B:
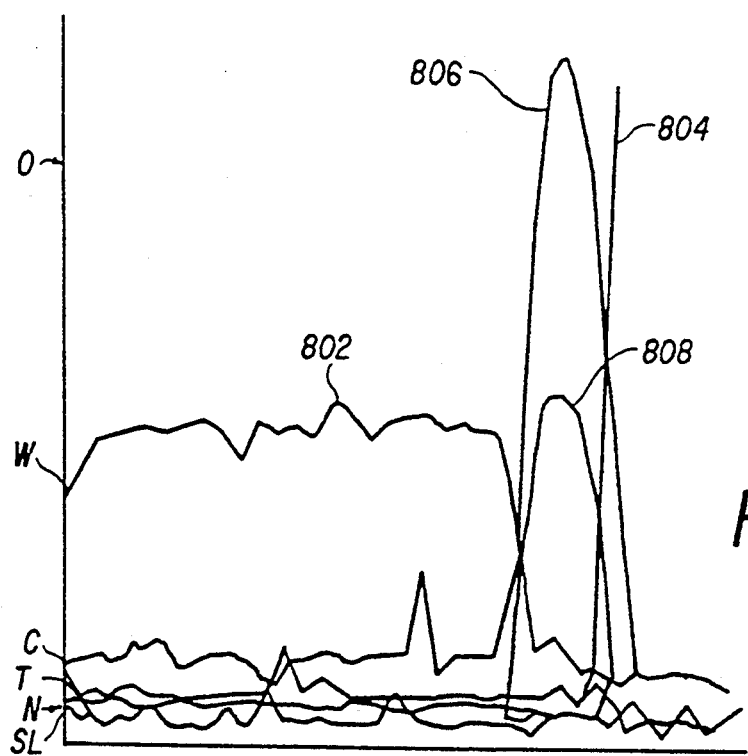

As shown in FIG. 3C, an electrically conductive interconnect layer 320 is formed over the barrier layer 318. The electrically conductive interconnect layer 320 preferably comprises a refractory metal having a relatively low resistivity, for example tungsten. It has been found in this structure that the tungsten does not interpenetrate the barrier layer, constructed for example using tantalum nitride, and silicon transport is similarly inhibited by the barrier layer. FIGS. 8A and 8B are Auger depth profiles of a tungsten/tantalum nitride/silicon structure in accordance with one embodiment of the present invention. FIG. 8A is the depth profile of the structure before heating and FIG. 8B is the depth profile of the structure after baking at 950° C. for thirty minutes. As can be seen in FIG. 8B, there is little silicon penetration into the tungsten layer and vice versa. This yields a structure which is of relatively low resistivity, approximately equal to 15 micro-ohm centimeters.

Figure 3D:
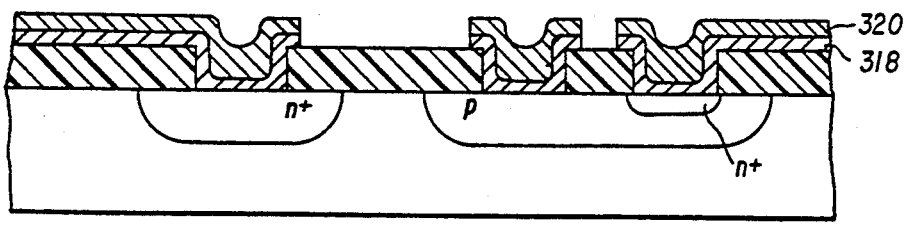
Figure 3E:
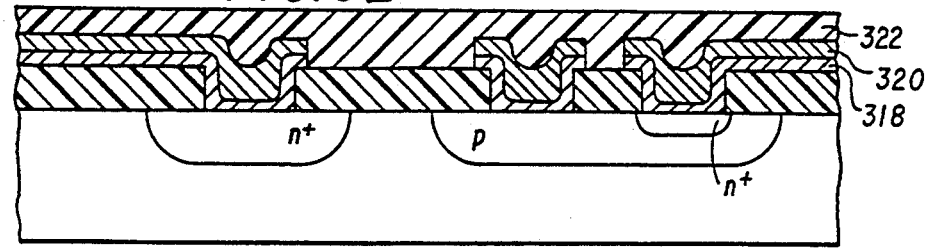

As shown in FIG. 3D, an interconnect pattern is defined in the interconnect layer 320 and underlying barrier layer 318 utilizing, for example, standard plasma etching techniques similar to those described with respect to the previous embodiments. Referring to FIG. 3E, the resulting structure is coated with a layer of insulating material 322, such as PVX glass, which is subsequently planarized in a manner previously described with respect to the preceeding alternate embodiments. The structure is then ready for fabrication of subsequent interconnect layers as previously described with respect to the preceeding alternate embodiment.

Referring now to FIG. 4, there is shown still another alternate preferred method for constructing a device in accordance with the present invention, once again starting with a bipolar transistor device, generally designated 400, which has been fabricated to the point at which metal contacts are to be formed. As depicted in FIG. 4A, the device 400 includes a silicon dioxide insulating layer 402 into which contact regions 404, 406 and 408 have been formed. As shown in FIG. 4B, a refractory metal disilicide layer 410 is formed over the silicon dioxide insulating layer 402 into the contact regions 404, 406 and 408 utilizing known deposition techniques such as chemical vapor deposition, sputtering, physical evaporation or ion beam deposition. The refractory metal disilicide layer 410 contacts the doped regions underlying the contact regions 406, 408 and 410. The refractory metal disilicide layer 410 is then patterned and etched, utilizing known photoresist and etching techniques, leaving islands 412, 414 and 416, in and around the contact regions 404, 406 and 408 respectively as shown in FIG. 4C. Referring to FIG. 4D, barrier layers 418, 420 and 422 are formed in islands 412, 414 and 416 respectively, preferably by either implanting boron, nitrogen or carbon into the refractory metal disilicide or placing the structure in a reactive ambient of boron, nitrogen or carbon, resulting in barrier layers comprising refractory metal borides, nitrides or carbides respectively.

Figure 4A:
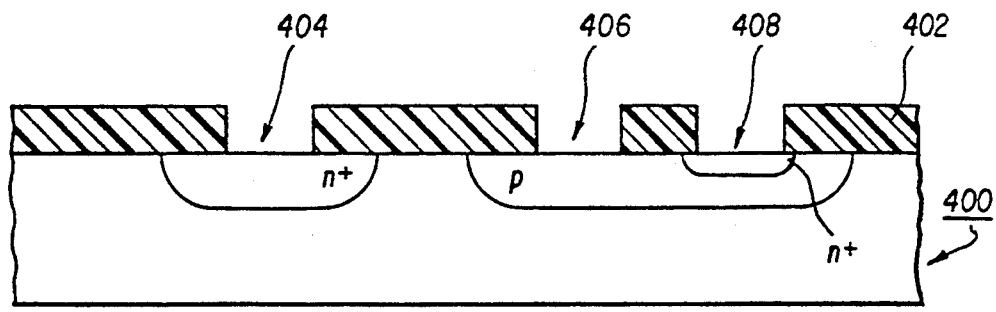
FIGS. 4A-G is a diagrammatic cross-sectional representation of the processing stages of still another alternate preferred method for constructing a device in accordance with the present invention.
Figure 4B:
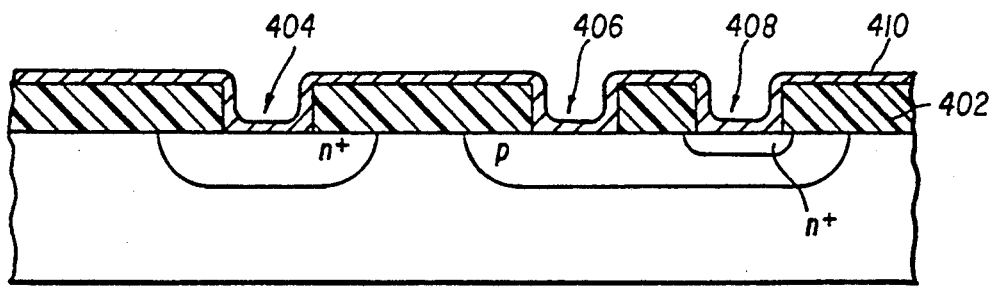
Figure 4C:
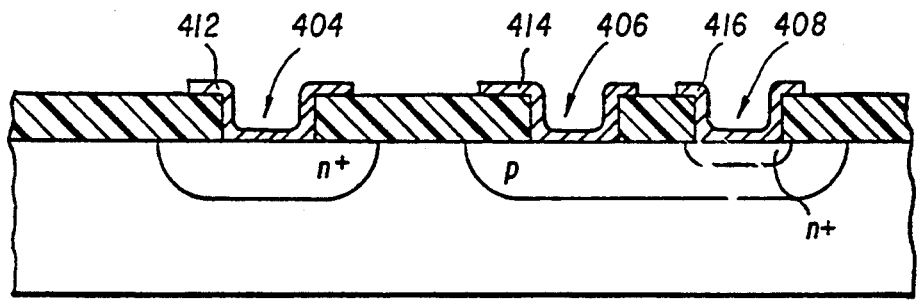
Figure 4D:
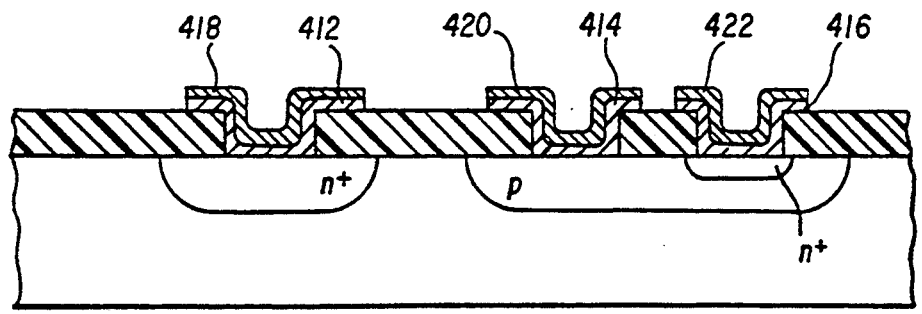
Figure 4E:
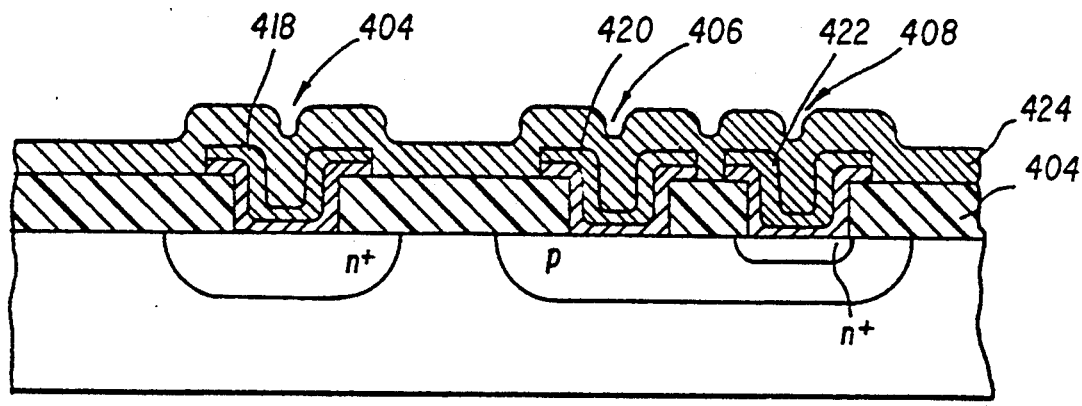
Figure 4F:
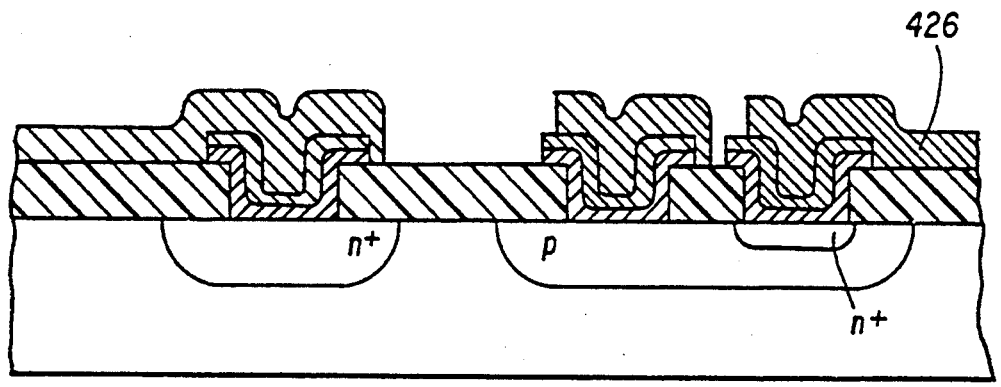
Figure 4G:
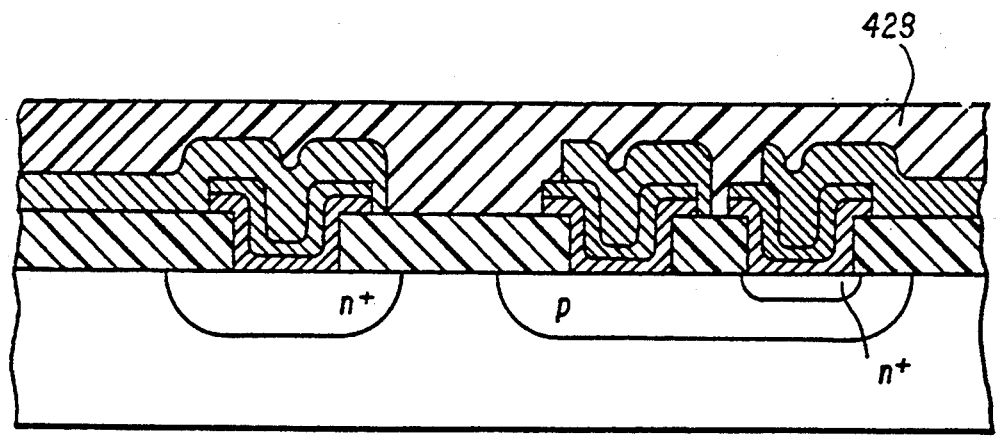

Referring to FIG. 4E, an electrically conductive interconnect layer 424, preferably comprising a refractory metal or a refractory metal compound, is formed over the silicon dioxide layer 402 and barrier layers 418, 420 and 422 into the contact regions 404, 406 and 408. The interconnect layer 424 is then patterned into interconnects 426 (see FIG. 4F) using etching techniques such as those described with respect to formation of interconnects in previous embodiments. As shown in FIG. 4G, PVX insulating layer 428 is then formed over the structure and planarized in preparation for the formation of additional interconnect levels as previously described with respect to other alternate embodiments.

Referring now to FIG. 5, there is shown a diagrammatic cross-sectional representation of the processing stages of still another alternate preferred method for constructing a device in accordance with the present invention. Once again, as shown in FIG. 5A, the starting point is a bipolar transistor device, generally designated 500, which has been fabricated to the point at which metal contacts are to be formed. The device 500 has contact regions 502, 504 and 506 formed in a silicon dioxide layer 508. Referring to FIG. 5B, refractory metal disilicide layers, 510, 512 and 514, are formed in contact regions 502, 504 and 506 respectively by, for example, the method described with respect to the first preferred embodiment as depicted in FIGS. 1A through 1D. These disilicide layers 510, 512 and 514 are in contact with the doped regions underlying the contact regions 502, 504 and 506 respectively. As shown in FIG. 5C, a barrier layer 516, preferably comprising a refractory metal nitride, boride or carbide, is deposited over the silicon dioxide layer 508 and the refractory metal disilicide layers 510, 512 and 514, by, for example, chemical vapor deposition, sputtering, physical examination or ion beam deposition.

Figure 5A:
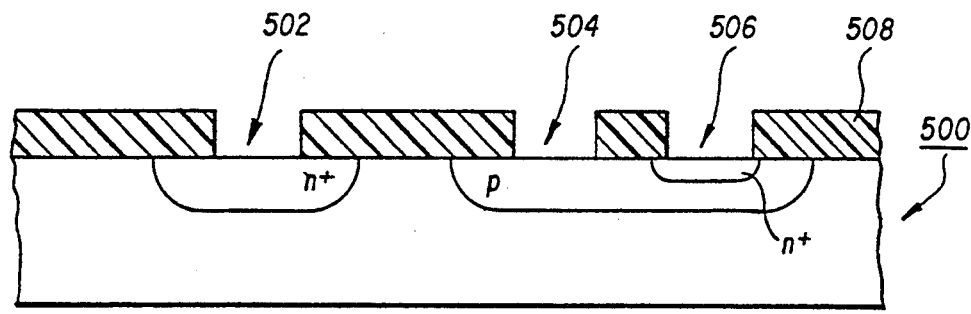
FIGS. 5A-G is a diagrammatic cross-sectional representation of the processing stages of an additional alternate preferred method for constructing a device in accordance with the present invention.
Figure 5B:
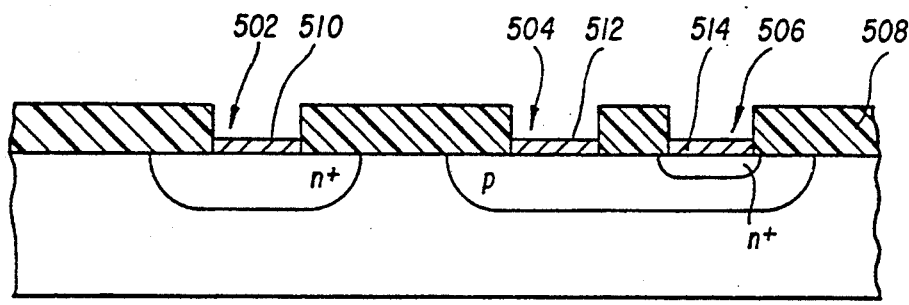
Figure 5C:
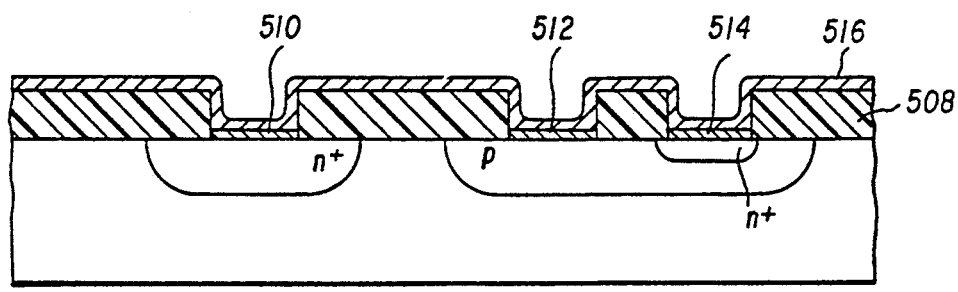
Figure 5D:
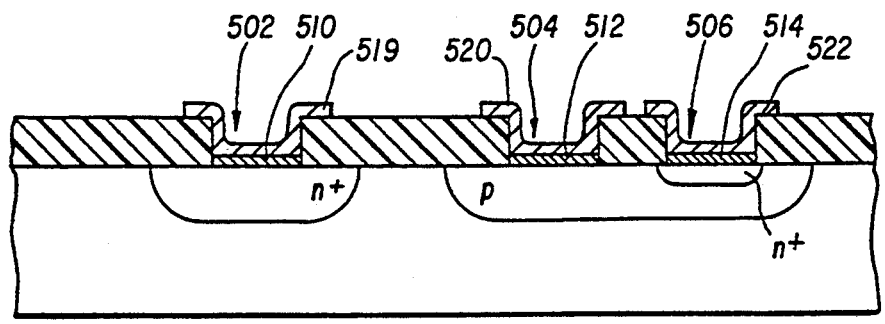
Figure 5E:
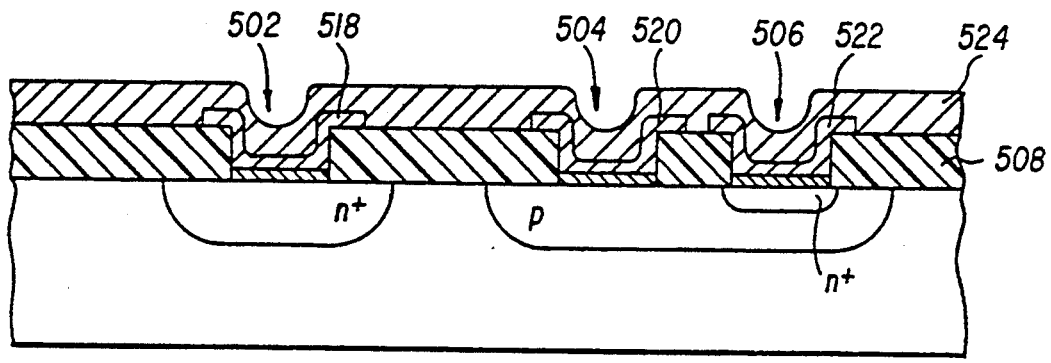
Figure 5F:
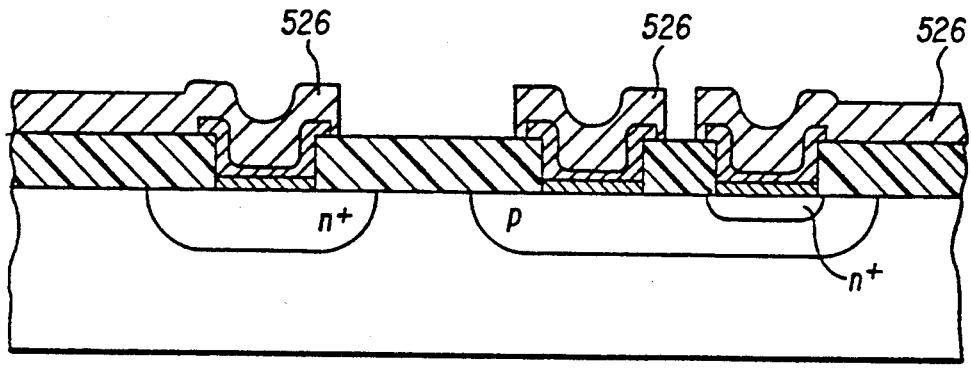
Figure 5G:
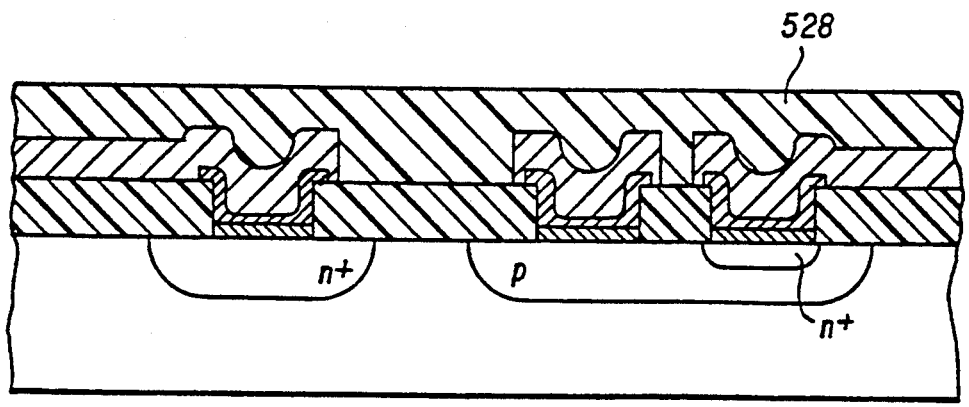

As shown in FIG. 5D, the barrier layer 516 is patterned and etched to form islands 518, 520 and 522 over the metal disilicide layers 510, 512 and 514 and around contact regions 502, 504 and 506 respectively. As shown in FIG. 5E, an electrically conductive interconnect layer 524 is formed over the silicon dioxide layer 508 and islands 518, 520 and 522, into contact regions 502, 504 and 506 respectively. As shown in FIG. 5F, the electrically conductive interconnect layer 524 is patterned and etched to form interconnects 526 using known techniques such as those previously described with respect to other alternate embodiments. The structure is then coated with an insulating layer 528 of, for example PVX glass, which is then planarized as shown in FIG. 5G in accordance with the method previously described. The structure is then ready for the formation of additional interconnect layers in accordance with the techniques previously described.

Yet another alternate preferred method for constructing a device in accordance with the present invention is shown, in diagrammatic cross-sectional form, in FIG. 6. The description of this alternate embodiment also begins with a bipolar transistor device, generally designated 600, which has been fabricated to the point at which metal contacts are to be formed as shown in FIG. 6A. The device 600 has contact regions 602, 604 and 606 formed in a layer of silicon dioxide 608. Referring to FIG. 6B, refractory metal disilicide layers 610, 612 and 614 are formed in contact regions 602, 604 and 606 in accordance with the technique previously described with respect to FIG. 5B. As shown in FIG. 6C, a barrier layer, preferably a refractory metal nitride, boride or carbide, is formed over the silicon dioxide layer 608 and refractory metal disilicide layers 610, 612 and 614 and into contact regions 602, 604 and 606 in accordance with the method previously described with respect to FIG. 5C.

Figure 6A:
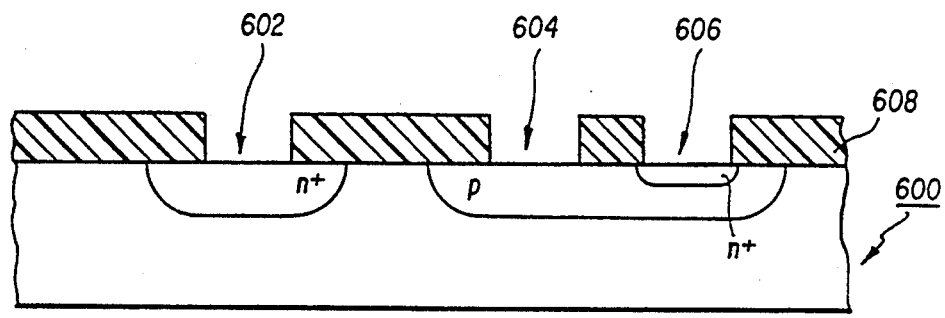
FIGS. 6A-E is a diagrammatic cross-sectional representation of the processing stages of still another alternate preferred method for constructing a device in accordance with the present invention.
Figure 6B:
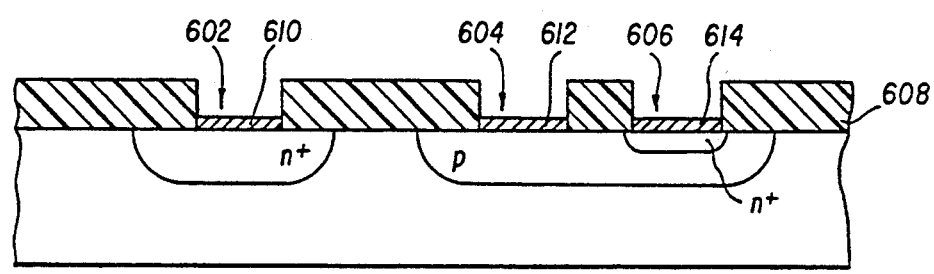
Figure 6C:
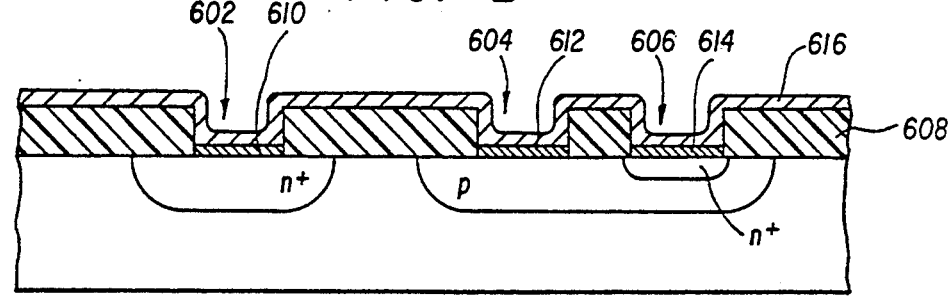
Figure 6D:
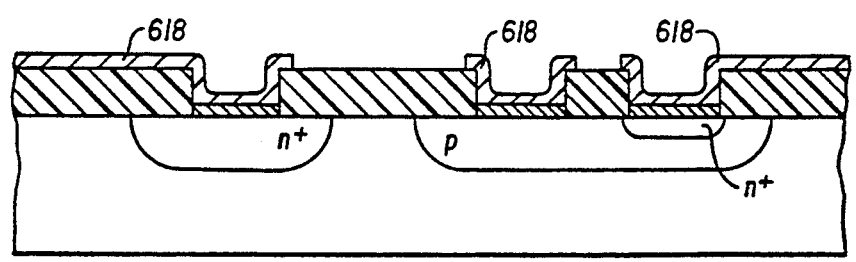
Figure 6E:
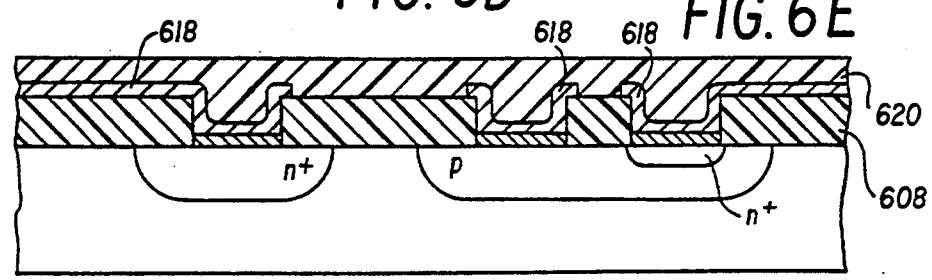

As shown in FIG. 6D, the barrier layer 616 is then patterned and etched, in accordance with previously described techniques, to form interconnects 618. As shown in FIG. 6E, an insulating layer 620, preferably PVX glass, is formed over the interconnect 618 and the silicon dioxide layer 608 then subsequently planarized. The structure is then ready for the fabrication of additional interconnect levels in the manner previously described with respect to alternate preferred embodiments.

One preferred method for forming multi-layer interconnect structures in accordance with the present invention is shown in FIG. 7. The description of this embodiment once again begins with a bipolar transistor device, generally designated as 700, which has been fabricated to the point at which metal contacts are to be formed as shown in FIG. 7A. The device 700 has contact regions 702, 704 and 706 formed in a layer of silicon dioxide layer 708 disposed over a doped silicon substrate 709. Referring to FIG. 7B, a barrier layer 710, comprising a metal nitride, boride or carbide which forms a stable couple with silicon at temperatures in excess of approximately 500° C., is formed over the silicon dioxide layer 708 into the contact regions 702, 704 and 706, making electrical contact with the underlined doped regions of the substrate 709. The composition of the barrier layer as well as the method of its formation over the silicon dioxide layer is the same as that described with respect to FIG. 2B.

Figure 7A:
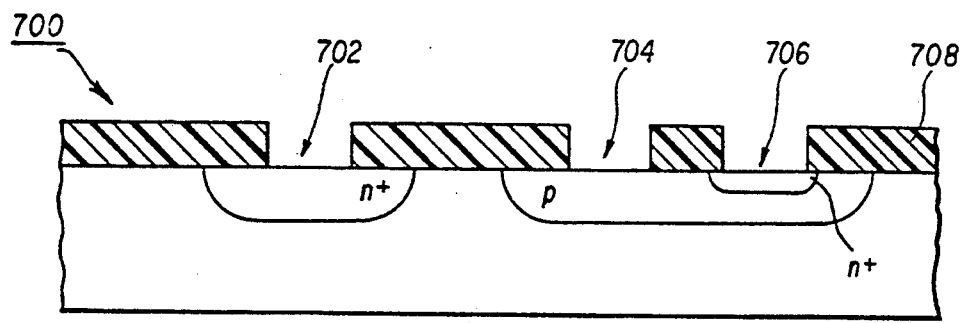
FIG. 7A-G is a diagrammatic cross-sectional representation of the processing stages of a preferred method for constructing a device having a multi-level intercell structure in accordance with the present invention.
Figure 7B:
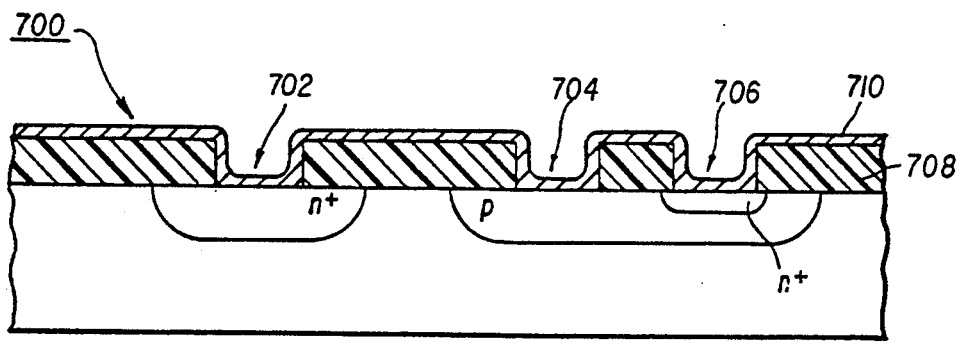
Figure 7C:
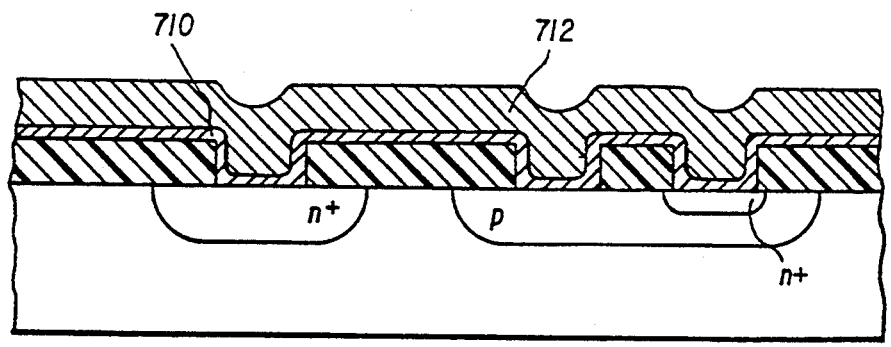
Figure 7D:
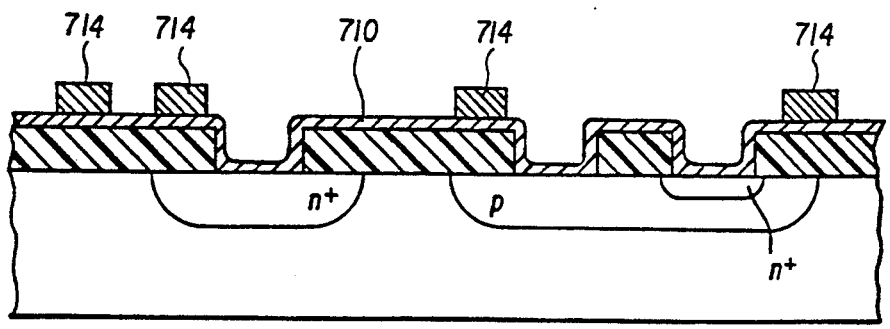

Referring to FIG. 7C, a layer 712, of a refractory metal such as tungsten, is formed over the barrier layer 710. The layer 712 is then masked, using conventional photoresist techniques, in order to define a desired pattern of vertical posts or vias therein. After the desired via pattern is formed, the refractory metal layer 712 is then etched, using an etchant which reacts with tungsten but not with the barrier layer material in any substantial manner. Preferably, an anisotropric etch process is used to define these via structures. Where the refractory metal layer 712 comprises tungsten, a fluorine based dry etchant is utilized. The photoresist mask allows the etching process to produce a pattern of vias in accordance with the predetermined mask pattern. Since the barrier layer does not react with the etchant, the etching process stops at the upper surface of the barrier layer 710 and, as shown in FIG. 7D, a predetermined patterns of vias 714 is formed on the barrier layer 710.

Figure 7E:
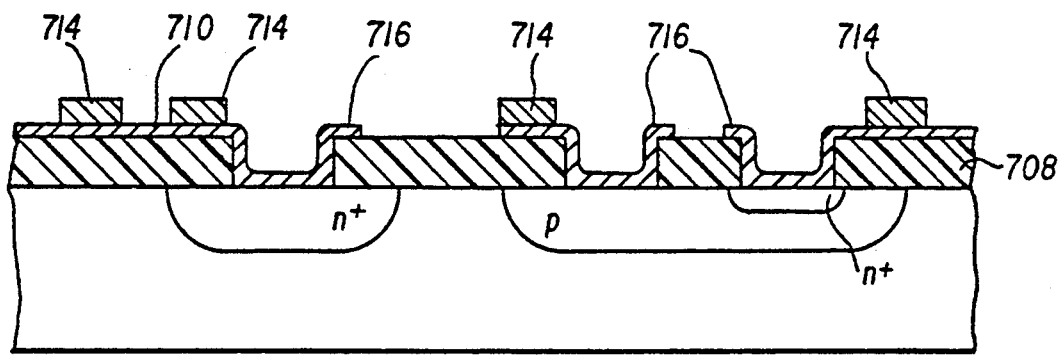

Following the formation of the vias 714, and removal of the photoresist used to define them, a second layer of a photoresist material is disposed over the barrier layer 710 and the defined pattern of via posts 714. The photoresist is then exposed in accordance with a predetermined interconnect pattern. The exposed photoresist pattern masks the barrier layer 710 against an etchant which reacts with the barrier layer material (which is preferably a refractory metal nitride, boride or carbide in this embodiment) and not with the via post material (which is preferably tungsten in this embodiment). The unprotected regions of the barrier layer 710 are then etched with the etchant which selectively removes the barrier layer material while not affecting the vias 714. Consequently, the barrier layer 710 is etched around the photoresist mask pattern as well as around the vias 714 down to the silicon dioxide layer 708, thereby forming the desired interconnect pattern 716 with the vias 714 disposed thereon, as shown in FIG. 7E.

Since the vias 714 are uneffected by the second etchant, they act as masks which prevents the second etchant from etching the barrier layer material disposed immediately underneath the vias. Consequently, it can be seen that even if the vias are misaligned with respect to the interconnect pattern, the interconnects will automatically be extended to coincide with the misaligned via thereby creating a contact area which is substantially coextensive with the bottom surface area of each via 714.

Figure 7F:
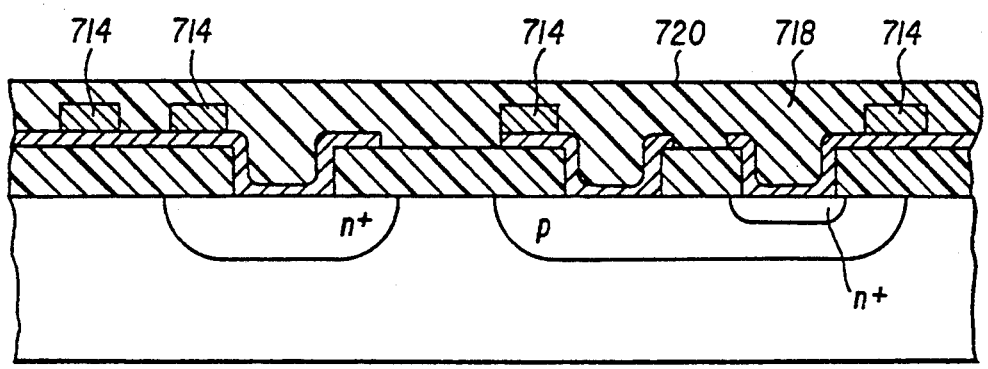

Referring now to FIG. 7F, this structure is coated with a layer of glass, preferably phosphovapox glass (PVX), which layer is thicker than the height of the via posts 714. The entire structure is then heated to a high temperature in the range of 800° C. to 1050° C., to enable the glass to flow under surface tension forces in order to smooth the surface topography of the structure as shown in FIG. 7F.

Figure 7G:
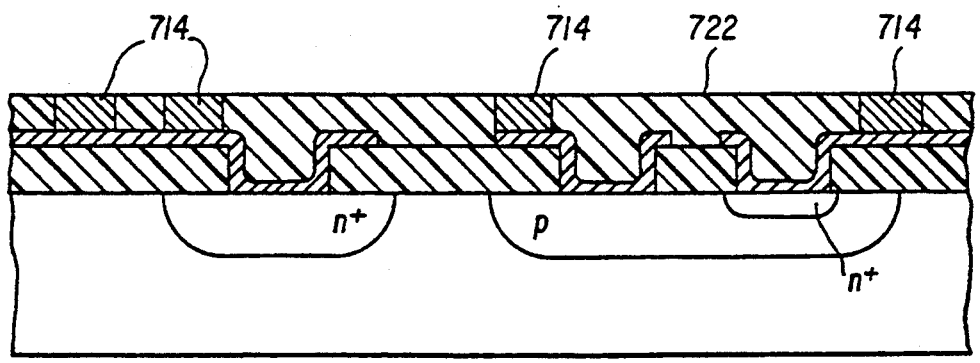

Once the upper surface 720 of the glass layer 718 is substantially planarized as shown in FIG. 7F, the layer 718 is etched back to form a substantially planar surface 722 which exposes the tops of the vias 714, as shown in FIG. 7G. It is preferred that the glass layer etchant be of a fluorine based chemistry ($CHF_3/C_2F_6$ mixture), which has a suitable selectivity of the glass over the via metal. The glass etchant may even react with the via metal as long as the etch rate of the glass is greater than or equal to the etch rate of via metal. A metal layer, which will be used to form a second layer of interconnects, may now be formed over the planar surface 722 of the glass layer 718 and the exposed tops of the vias 714. This metal layer is then formed into the second interconnect layer using conventional photoresist techniques.

Referring now to FIG. 8, there is shown Auger depth profiles of an embodiment of the structure utilizing a silicon transport barrier in accordance with the present invention. FIG. 7A depicts the depth profile of this structure, which comprises a tantalum nitride barrier layer disposed between a silicon substrate and a tungsten layer formed thereover. Curve 802 represents the depth profile of the tungsten material and curve 804 represents the depth profile of the silicon material. The barrier layer is represented by curves 806 and 808 which are depth profiles of the tantalum and nitrogen respectively. After heating the structure at 950° C. for one-half hour, the Auger depth profile of FIG. 8(B) was taken. As can be seen from the tungsten and silicon depth profile curves 802, 804 respectively, there was very little silicon penetration into the tungsten or vice-versa.

As can be seen from these descriptions of the alternate preferred embodiments of the present invention, the barrier layer of the present invention comprises a material which forms a stable couple with silicon at elevated temperatures. That is, the barrier layer prevents the migration of silicon into the contact regions at high temperatures while itself resisting degradation. In some embodiments, the barrier layer comprises materials of sufficiently low resistivity that they form suitable electrical interconnects as well as a stable barrier of elevated temperatures. In other embodiments, the barrier layer forms a barrier between the underlying silicon and the electrically conductive interconnects which, in accordance with the present invention, are formed of refractory metals which do not degrade at elevated temperatures. This high temperature stability permits the utilization of high temperature processing techniques, such as glass reflow planarization, as well as enabling the device to operate at high temperatures without failure or degradation.

As previously stated, as the dimensions of the emitter contacts decrease, the possibility of enhanced current crowding, premature electromigration failure and junction spiking in bipolar transistors becomes more probable. The use of refractory metals as the interconnect material, in accordance with the present invention, is desirable since these metals have greater electromigration resistance than Al and the use of thicker refractory metal lines reduces the effective current density passing through the circuit. The metal nitride, boride or carbide layers provide very good barriers to silicon or metal diffusion during service operation and play an important role in reducing shallow junction spiking. The barrier also eliminates silicide formation since it does not allow the refractory interconnect material to see silicon.

In addition, since the structures of the present invention are able to tolerate high temperature processing, interlayer topographies can be smoothed using PVX reflow techniques. Consequently, although the refractory metallization in accordance with the present invention is thicker than presently used aluminum metallizations, this reflow technique can be used to smooth the rough topographies generated, thereby making multi-level metallization schemes of this nature a reality.

It will be understood that various changes in the details, materials, and arrangement of the parts which have been described and illustrated in order to explain the nature of this invention, may be made by those skilled in the art without departing from the principal and scope of the invention as expressed in the following claims.

What is claimed is:

1. In a semiconductor integrated circuit device including a silicon substrate having a predetermined pattern of doped regions formed therein and contact regions disposed on a surface of said device, each contact region exposing at least a portion of an underlying doped region, means for electrically interconnecting said doped regions, said means comprising a system of electrical interconnects, consisting of a metal carbide material disposed directly on and into electrical contact with the underlying doped region, wherein said metal is selected from the group consisting essentially of tungsten, molybdenum, tantalum, titanium, niobium, zirconium, vanadium and chromium, which forms a stable thermodynamic couple with silicon and compounds thereof at temperatures exceeding approximately 500° C., which system electrically interconnects said doped regions through said contact regions in accordance with a predetermined pattern.

* * * * *